US012682802B2

(12) United States Patent
Kuang et al.

(10) Patent No.: US 12,682,802 B2
(45) Date of Patent: Jul. 14, 2026

(54) GATE DRIVER, DISPLAY PANEL AND DISPLAY DEVICE

(71) Applicant: Xiamen Tianma Display Technology Co., Ltd., Xiamen (CN)

(72) Inventors: Jian Kuang, Xiamen (CN); Xingyao Zhou, Xiamen (CN); Yana Gao, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/970,243

(22) Filed: Dec. 5, 2024

(65) Prior Publication Data

US 2026/0073827 A1     Mar. 12, 2026

(30) Foreign Application Priority Data

Sep. 11, 2024     (CN) .......................... 202411272978.3

(51) Int. Cl.
*G09G 3/20* (2006.01)
*H03K 17/687* (2006.01)

(52) U.S. Cl.
CPC ........... *G09G 3/20* (2013.01); *H03K 17/6872* (2013.01); *G09G 2310/0267* (2013.01); *G09G 2320/0233* (2013.01)

(58) Field of Classification Search
CPC ......... G09G 2310/0286; G09G 3/3266; G09G 2310/08; G09G 3/3674; G09G 3/20
See application file for complete search history.

(56) References Cited

U.S. PATENT DOCUMENTS

| | | | |
|---|---|---|---|
| 12,424,156 B1 * | 9/2025 | Kuang | G11C 19/287 |
| 2018/0330667 A1 * | 11/2018 | Yuan | G09G 3/3266 |
| 2021/0019016 A1 * | 1/2021 | Ding | G06F 3/0421 |
| 2021/0174717 A1 * | 6/2021 | Li | G09G 3/20 |
| 2021/0327347 A1 * | 10/2021 | Xu | G09G 3/2092 |
| 2022/0122534 A1 * | 4/2022 | Kim | G09G 3/3233 |
| 2025/0081610 A1 * | 3/2025 | Xiao | G09G 3/3266 |

FOREIGN PATENT DOCUMENTS

CN          109064981 A     12/2018

* cited by examiner

*Primary Examiner* — Van N Show
(74) *Attorney, Agent, or Firm* — Anova Law Group, PLLC

(57)          ABSTRACT

The present disclosure provides a gate driver, a display panel and a display device. The gate driver includes a plurality of levels that sequentially output a gate control signal through a gate control line. Each level includes a driving circuit and a gating circuit, where the driving circuit includes a pull-up module; the gating circuit includes a gating control signal writing module, and the gating control signal writing module includes a first switch. The gate of the first switch in each level, except the first level of the plurality of levels, is connected to a first node of a previous-level driving circuit, and the voltage of the first node is configured to drive the pull-up module.

20 Claims, 15 Drawing Sheets

100

GATE DRIVER, DISPLAY PANEL AND DISPLAY DEVICE

CROSS-REFERENCE TO RELATED APPLICATION

This application claims the priority of Chinese Patent Application No. 202411272978.3, filed on Sep. 11, 2024, the content of which is incorporated herein by reference in its entirety.

TECHNICAL FIELD

The application relates to the field of display technology, and in particular to a gate driver, a display panel and a display device.

BACKGROUND

Typically, a display device includes a display panel and a display panel driver. The display panel includes a plurality of gate lines, a plurality of data lines, a plurality of emission lines and a plurality of pixels. The display panel driver includes a gate driver, a data driver, an emission driver and a drive controller. The gate driver outputs gate control signals to the plurality of gate lines respectively. The data driver outputs data voltages to the plurality of data lines respectively. The emission driver outputs emission control signals to the plurality of emission lines respectively.

The gate driver for partition refresh includes a multi-level structure, and any level includes a driving circuit and a gating circuit. Generally, the gate of the switch unit to which the gating control signal of the gating circuit is written is connected to the output signal of the driving circuit. Since the output signal of the driving circuit is normally low, the gating control signal and the high voltage are coupled through a capacitor in most states. Since the coupling capacitor is large, when the gating control signal hops at the partition refresh boundary, the gating control signal changes from high to low, and the high voltage outputted by the low-level output is pulled down through the capacitor coupling, resulting in an insufficient high voltage of a pixel being compensated, resulting in a dark display. That is, the partition refresh boundary split screen phenomenon occurs.

SUMMARY

In one aspect, the present disclosure provides a gate driver, which includes a plurality of levels that sequentially output a gate control signal through a gate control line, each of the levels including a driving circuit and a gating circuit. The driving circuit includes a pull-up module. The gating circuit includes a gating control signal writing module, where the gating control signal writing module includes a first switch, where a gate of the first switch in each level, except a first level among the plurality of levels, is connected to a first node of a previous-level driving circuit, and a voltage of the first node is configured to drive the pull-up module.

In another aspect, the present disclosure provides a display panel that includes a gate driver that includes a plurality of levels that sequentially output a gate control signal through a gate control line, each of the levels including a driving circuit and a gating circuit. The driving circuit includes a pull-up module. The gating circuit includes a gating control signal writing module, where the gating control signal writing module includes a first switch, where a gate of the first switch in each level, except a first level among the plurality of levels, is connected to a first node of a previous-level driving circuit, and a voltage of the first node is configured to drive the pull-up module. The display panel further includes a gating control signal generator, configured to generate a gating control signal; an input signal generator, configured to generate an input signal; a first clock signal generator, configured to generate a first clock signal; and a second clock signal generator, configured to generate a second clock signal.

In another aspect, the present disclosure provides a display device. The display device includes a display panel that includes a gate driver. The gate driver includes a plurality of levels that sequentially output a gate control signal through a gate control line, each of the levels including a driving circuit and a gating circuit. The driving circuit includes a pull-up module. The gating circuit includes a gating control signal writing module, where the gating control signal writing module includes a first switch, where a gate of the first switch in each level, except a first level among the plurality of levels, is connected to a first node of a previous-level driving circuit, and a voltage of the first node is configured to drive the pull-up module.

Other aspects of the present disclosure can be understood by those skilled in the art in light of the description, the claims, and the drawings of the present disclosure.

BRIEF DESCRIPTION OF THE DRAWINGS

The drawings constituting part of the present disclosure are used to provide a further understanding of the present disclosure. The exemplary embodiments and descriptions of the present disclosure are used to explain the present disclosure and do not constitute an improper limitation on the present disclosure. In the drawings.

Figure 1:
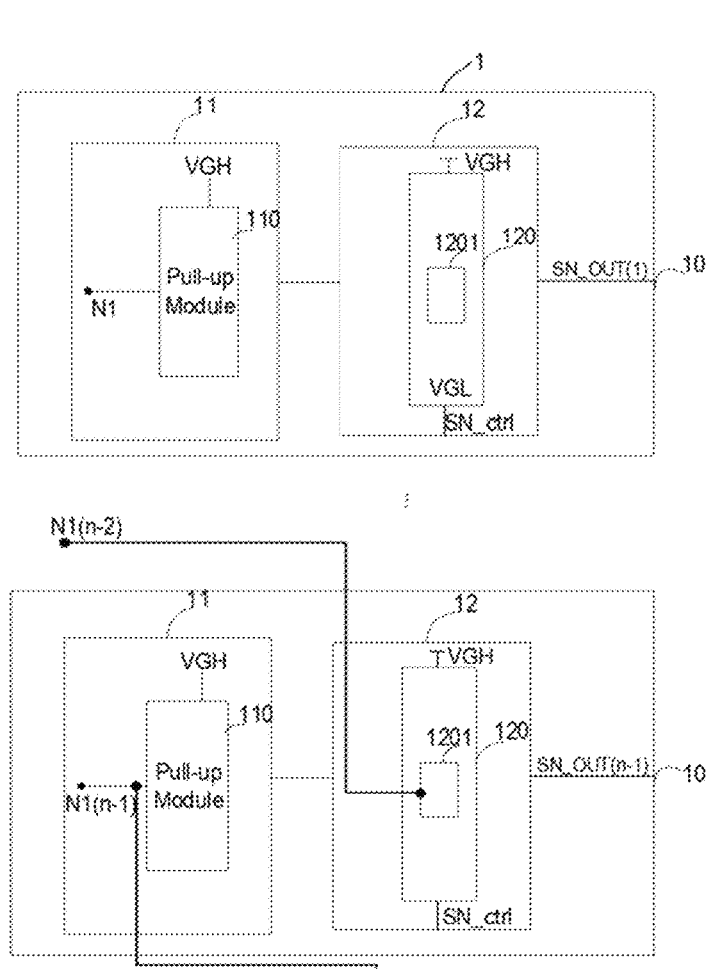
FIG. 1 shows a schematic diagram of a gate driver, according to an embodiment of the present disclosure.
Figure 1:
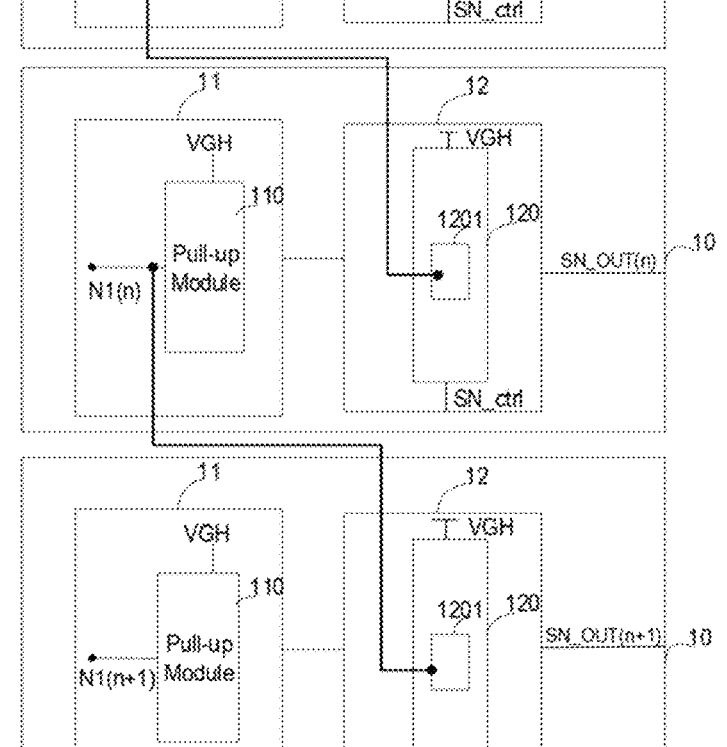

The above drawings include the following reference numerals:

1. gate driver; 2. gating control signal generator; 3. input signal generator; 4. first clock signal generator; 5. second clock signal generator; 6. pixel unit; 7. data driver; 8. emission driver; 100. display panel; 10. level; 11. driving circuit; 12. gating circuit; 110. pull-up module; 111. pull-down module; 112. pull-up control module; 113. pull-down control module; 120. gating control signal writing module; 121. gating control module; 122. gating output module; 1201. first switch.

DETAILED DESCRIPTION

It should be noted that the following detailed descriptions are illustrative and are intended to provide further explanation of the present disclosure. Unless otherwise specified, all technical and scientific terms used herein have the same meanings as those commonly understood by those skilled in the art to which the present disclosure belongs.

It should be noted that the terms used herein are merely for describing specific embodiments and are not intended to limit the exemplary embodiments according to the present disclosure. As used herein, unless the context clearly indicates otherwise, the singular form is also intended to include the plural form. In addition, it should be understood that when the terms "comprising" and/or "including" are used in this specification, it indicates the presence of features, steps, operations, devices, components and/or combinations thereof.

It should be understood that when an element (such as a layer, film, area, or substrate) is described as being "on" another element, the element may be directly on the other element, or there may be intermediate elements. Moreover, in the specification and claims, when it is described that an element is "connected" to another element, the element may be "directly connected" to the other element, or "connected" to the other element through a third element.

As introduced in the background technology, the multi-level driving structure of the gate driver in the existing technologies is prone to the phenomenon of partition refresh boundary split screen during partition driving. In order to solve the problem that the multi-level driving structure of the gate driver is prone to the phenomenon of partition refresh boundary split screen during partition driving as described above, the present disclosure provides a gate driver, a display panel and a display device.

FIG. 1 illustrates a gate driver in accordance with an embodiment of the present disclosure. The gate driver 1 includes a plurality of levels 10 that sequentially output a gate control signal SN_OUT through a gate control line. Each level 10 includes a driving circuit 11 and a gating circuit 12, where the driving circuit 11 includes a pull-up module 110, and the gating circuit 12 includes a gating control signal writing module 120. The gating control signal writing module 120 includes a first switch 1201. The gate of the first switch 1201 in each level 10, except the first level in the plurality of levels 10, is connected to the first node of a previous-level driving circuit 11, and the voltage of the first node N1 is configured to drive a next-level pull-up module 110.

FIG. 1 shows that the voltage N1($n$–2) of the first node of the (n–2)-th level drives the first switch 1201 in the (n–1)-th level, the voltage N1($n$–1) of the first node of the (n–1)-th level drives the first switch 1201 in the n-th level, and the voltage N1($n$) of the first node of the n-th level drives the first switch 1201 in the (n+1)-th level.

In the above, the gate of the first switch 1201 in each level 10, except the first level, among the plurality of levels 10 is connected to the first node of the previous-level driving circuit 11. That is, under this connection mode, a new first switch is added in the gating control signal writing module and is driven by the voltage of the first node of the driving circuit. Since the first node is usually a high-level signal, the first switch 1201 is usually in the off state, thereby reducing the coupling between the signal SN_ctrl input to the gating control signal writing module and VGH, thereby avoiding the partition refresh boundary split screen phenomenon.

Figure 2:
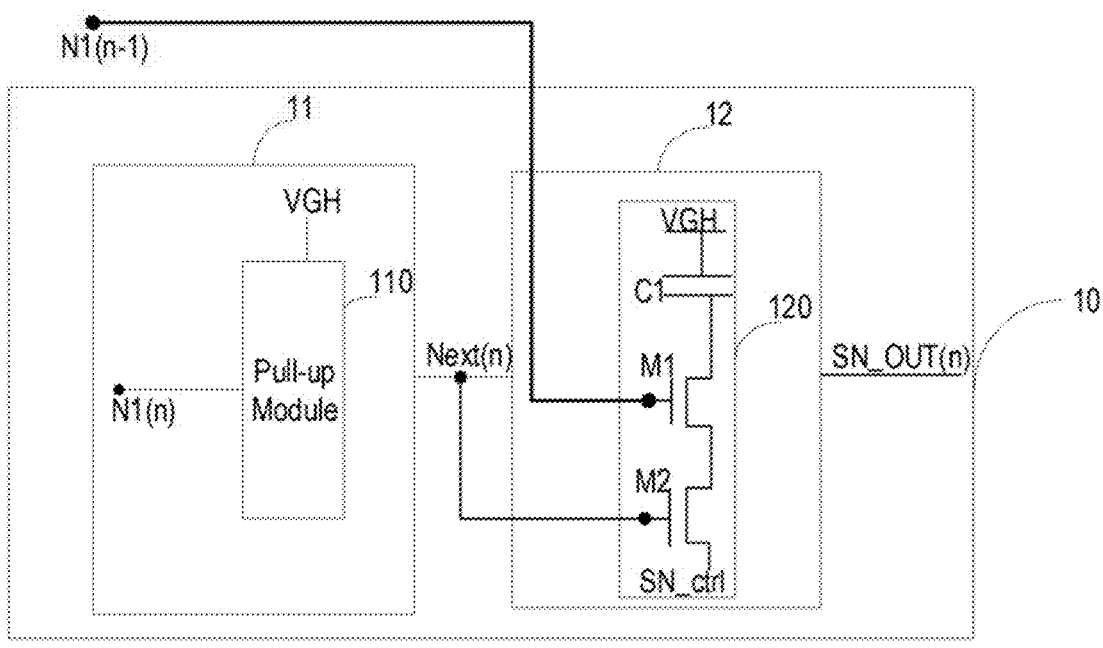
FIG. 2 shows a schematic diagram of an n-th level in a gate driver, according to an embodiment of the present disclosure.

Further, as shown in FIG. 2, the gating control signal writing module 120 further includes a capacitor C1 and a second switch M2. The capacitor C1, the first switch M1 (equivalent to the first switch 1201 in FIG. 1) and the second switch M2 are connected in series. The first plate of the capacitor is connected to a first power supply. The gate of the second switch is connected to the output end of the driving circuit. The signal input end of the second switch inputs the gating control signal SN_ctrl.

Figure 3:
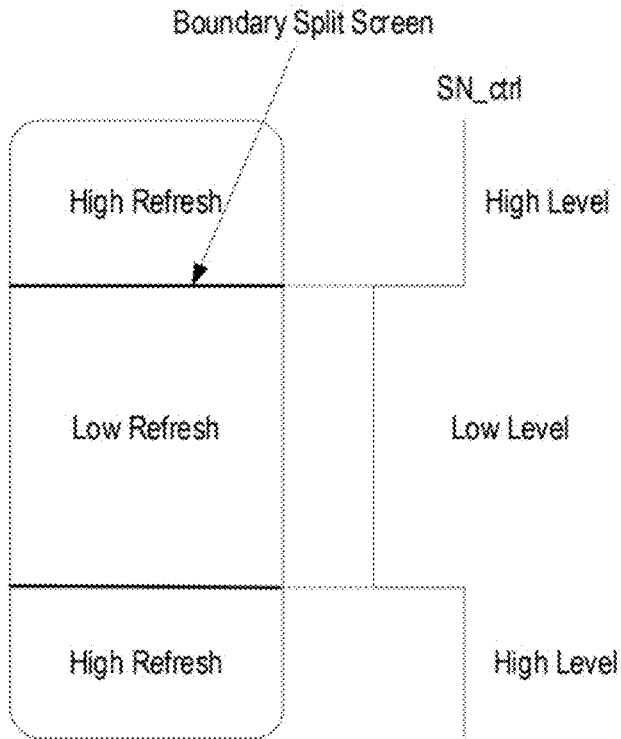
FIG. 3 shows a schematic diagram of a boundary split screen, according to an embodiment of the present disclosure.

In the existing technologies, the first switch is not set in the gating control signal writing module, the gating control signal is input to the signal input end of the second switch, and the gate of the second switch is connected to the Next(n) signal. The Next signal is usually normally low, so in most states, SN_ctrl and VGH are connected through capacitor coupling. The SN_ctrl coupling capacitance is very large. When SN_ctrl hops at the partition refresh boundary, SN_ctrl changes from high to low, which will pull down the VGH output by SN through capacitor coupling, resulting in insufficient VGH of a pixel SN being compensated, resulting in dark display, that is, the phenomenon of boundary split screen occurs, as shown in FIG. 3.

The function of a gating circuit is to control whether the effective high level of Next is output to SN_OUT by writing the potential of the lower plate of capacitor C1 through the SN_ctrl signal.

By adopting the solution of the present disclosure, the signal written by SN_ctrl is changed from being controlled by Next(n) to being jointly controlled by the N1 node signal of the previous level and Next(n), thereby ensuring that SN_ctrl is not connected to the lower plate of capacitor C1 most of the time, thereby reducing the coupling between SN_ctrl and VGH, effectively ensuring that the effective high level of Next is output to SN_OUT, and improving the boundary split screen.

Specifically, the first switch and the second switch are both P-type switch tubes.

Figure 4:
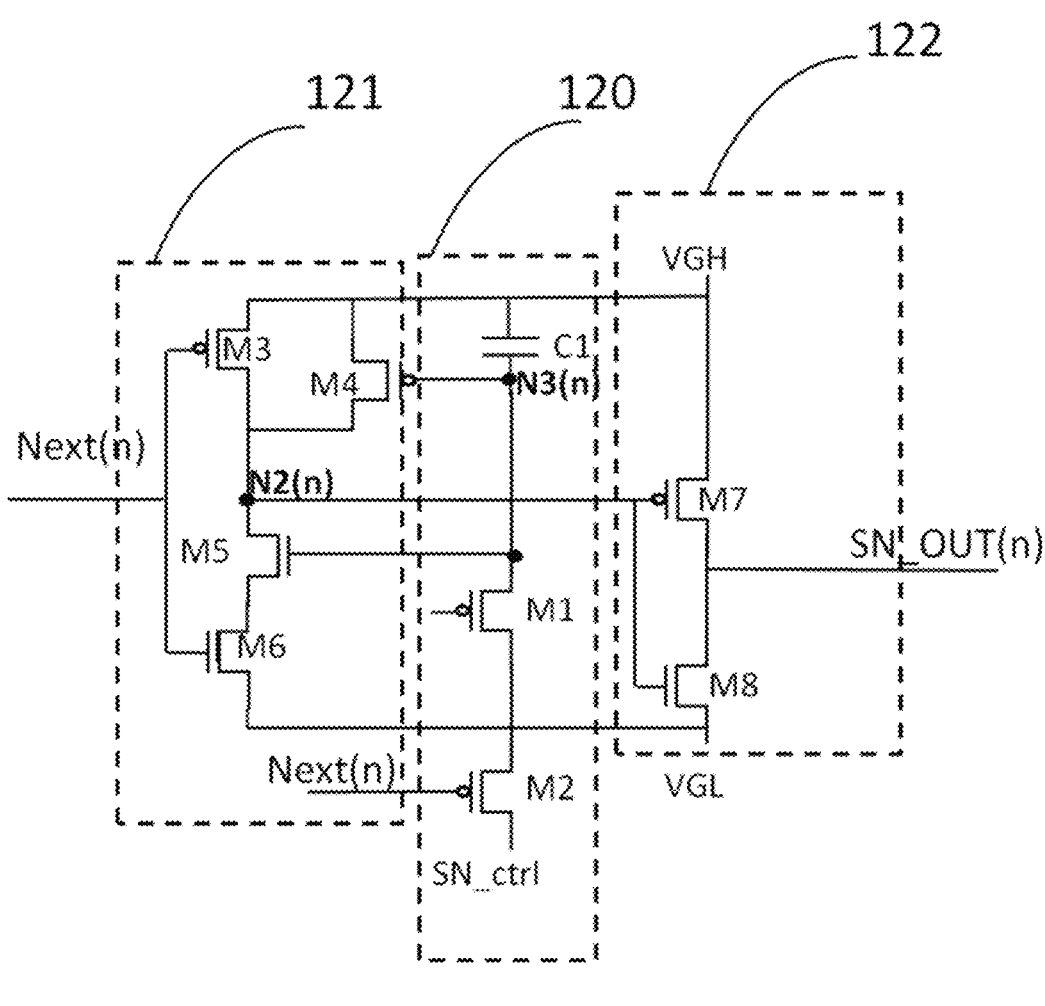
FIG. 4 shows a schematic diagram of a gating circuit, according to an embodiment of the present disclosure.

Further, the gating circuit also includes a gating control module and a gating output module. The output end of the driving circuit is connected to the gates of certain switch(es) in the gating control module, and the gating output module outputs a gate control signal. Under the action of the gating control signal and the output signal of the driving circuit, the certain switch(es) in the gating control module is controlled to be turned on or off so that the gate control signal is a high level or a low level. FIG. 4 shows the connection relationship between the gating control module 121, the gating control signal writing module 120, and the gating output module 122. The output signal Next(n) of the driving circuit is input to the gating control module 121 and the gate of the second switch M2.

More specifically, as shown in FIG. 4, the gating control module 121 includes a third switch M3, a fourth switch M4, a fifth switch M5 and a sixth switch M6. The third switch M3 and the fourth switch M4 are coupled between the second node N2 and the first power supply VGH. The fifth switch M5 and the sixth switch M6 are coupled between the second node and the second power supply VGL. The gate of the third switch M3 and the gate of the sixth switch M6 are connected to the output terminal Next(n) of the driving circuit. The gate M4 of the fourth switch is connected to the second plate of the capacitor C1, and the gate of the fifth switch M5 is connected to the first end of the first switch M1.

As shown in FIG. 4, the third switch M3 and the fourth switch M4 are both P-type switch tubes, and the fifth switch M5 and the sixth switch M6 are both N-type switch tubes.

Specifically, as shown in FIG. 4, the gating output module 122 includes a seventh switch M7 and an eighth switch M8. The seventh switch M7 is connected to the first power source VGH, and the gate of the seventh switch M7 and the gate of the eighth switch M8 are coupled to the second node N2.

A second end of the seventh switch M7 is connected to a second end of the eighth switch M8, a first end of the eighth switch M8 is connected to the second power source VGL, and a control signal line outputting the gate control signal SN_OUT is led between the second ends of the seventh switch M7 and the eighth switch M8.

Further, as shown in FIG. 4, the seventh switch M7 is a P-type switch tube, and the eighth switch M8 is an N-type switch tube.

It should be noted that the specific structure shown in FIG. 4 of the present disclosure is merely an optional embodiment. Under the condition of ensuring that the capacitor C1, the second switch M2 and the first switch M1 are included, various circuit structure derivatives equivalent to FIG. 4 can be obtained by adding or changing the positions of switches.

Figure 5:
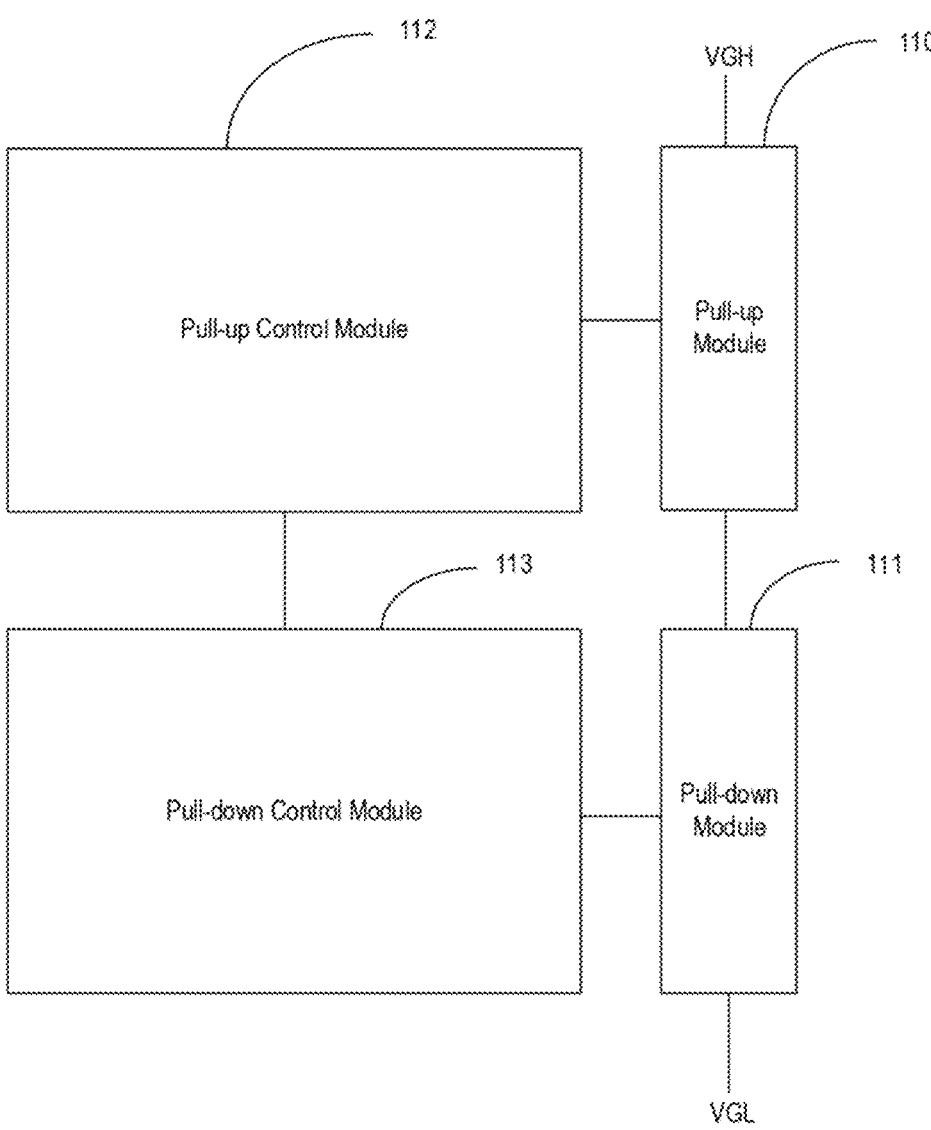
FIG. 5 shows a schematic diagram of a first driving circuit, according to an embodiment of the present disclosure.

As shown in FIG. 5, the driving circuit also includes a pull-down module 111, a pull-up control module 112 and a pull-down control module 113. The pull-up control module 112 is configured to generate a pull-up driving signal for driving the pull-up module, and the pull-down control module 113 is configured to generate a pull-down driving signal for driving the pull-down module 111. The pull-up module 110 and the pull-down module 111 are coupled between a first power supply VGH and a second power supply VGL. A common node of the pull-up module 110 and the pull-down module 111 leads to a signal line to output the output signal of the driving circuit.

Figure 6:
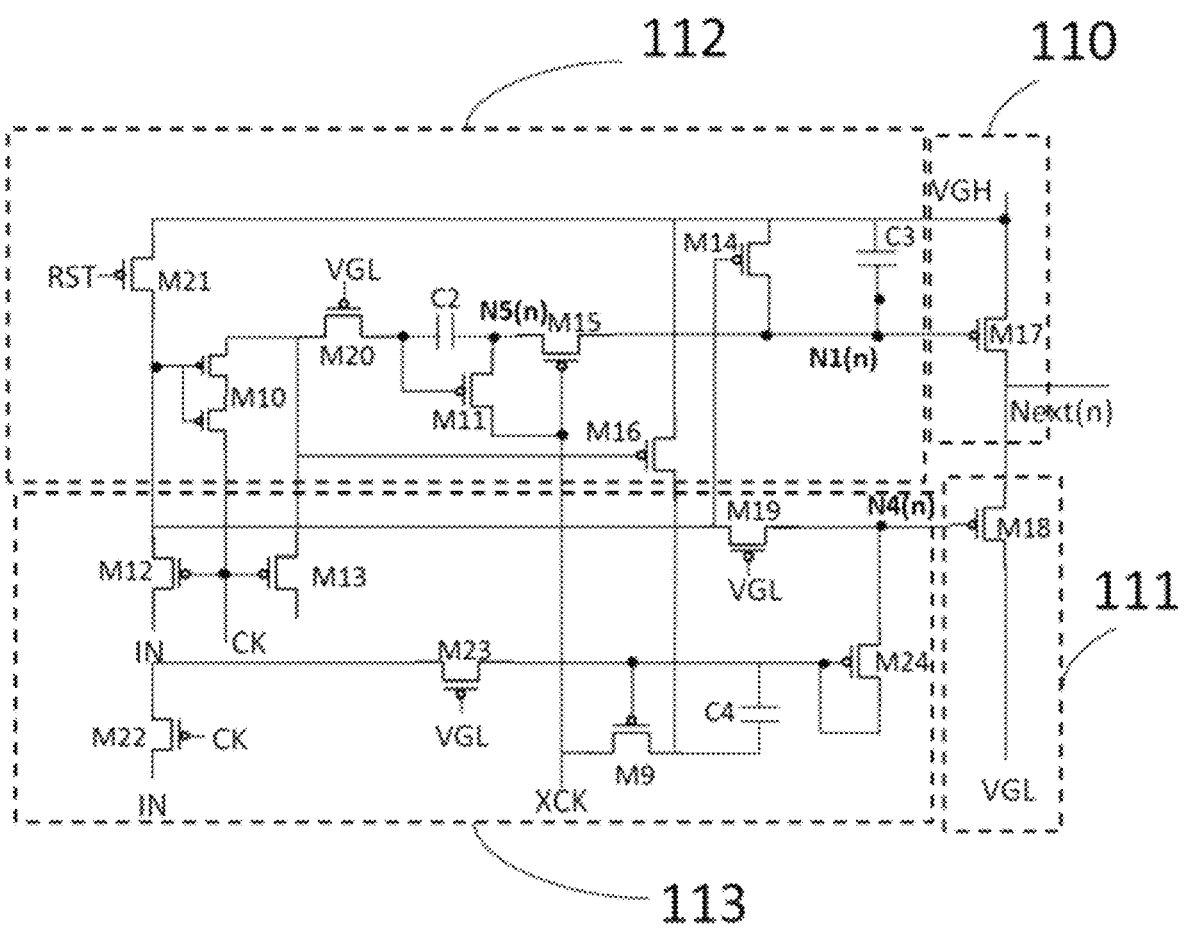
FIG. 6 shows a schematic diagram of a second driving circuit, according to an embodiment of the present disclosure.

As shown in FIG. 6, both the pull-up module M17 and the pull-down module M18 are P-type switch tubes.

Apparently, the driving circuit shown in FIG. 6 of the present disclosure is merely one optional solution. Other driving circuits can also be used in the solution applied to the present disclosure. It is only necessary to ensure that, in the other driving circuits, the node equivalent to the N1 node in FIG. 6 is connected to the gate of the next-level first switch.

Figure 7:
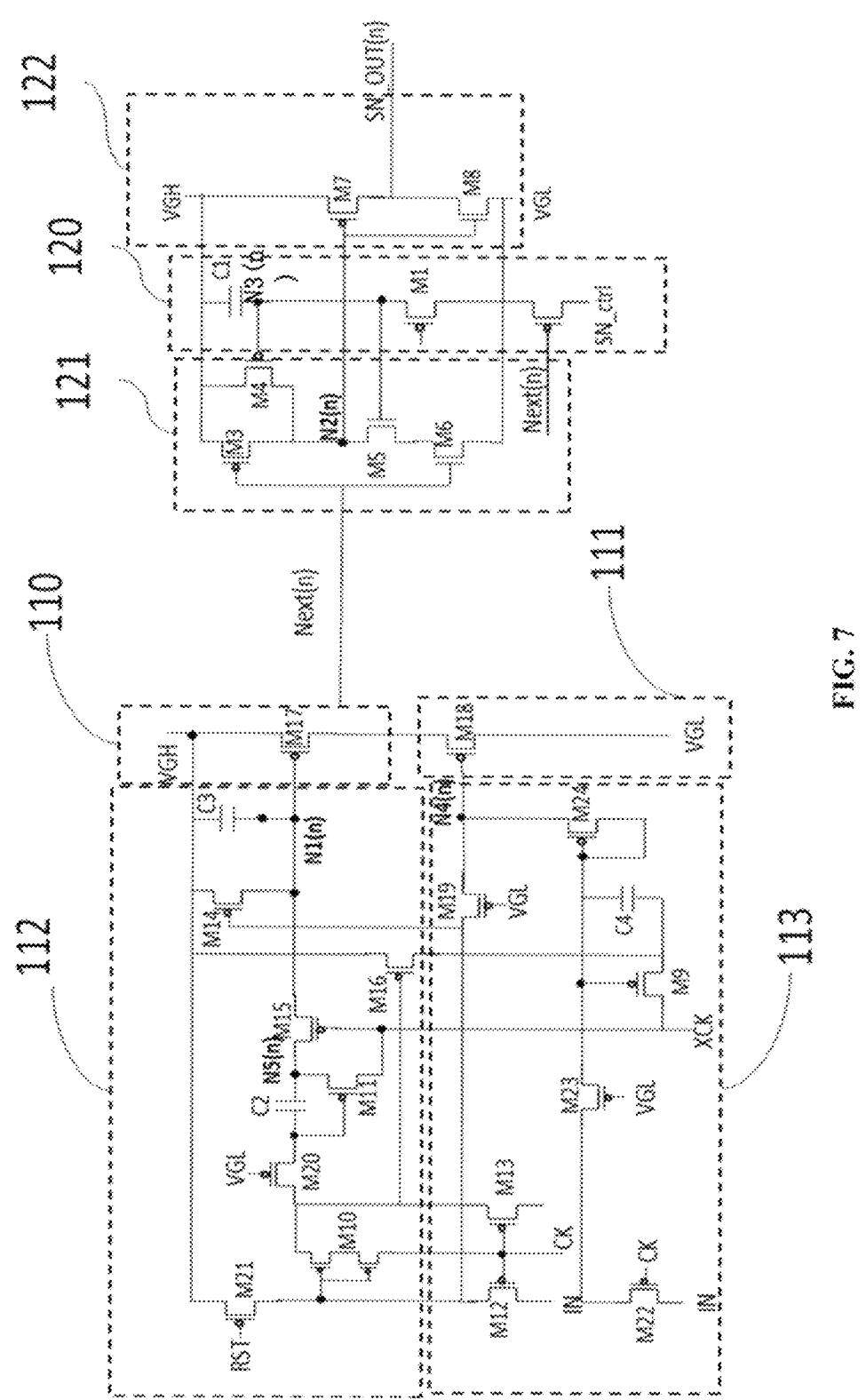
FIG. 7 shows a schematic diagram of a specific level, according to an embodiment of the present disclosure.

FIG. 7 shows a schematic diagram of a level in a specific gate driver.

Figure 8:
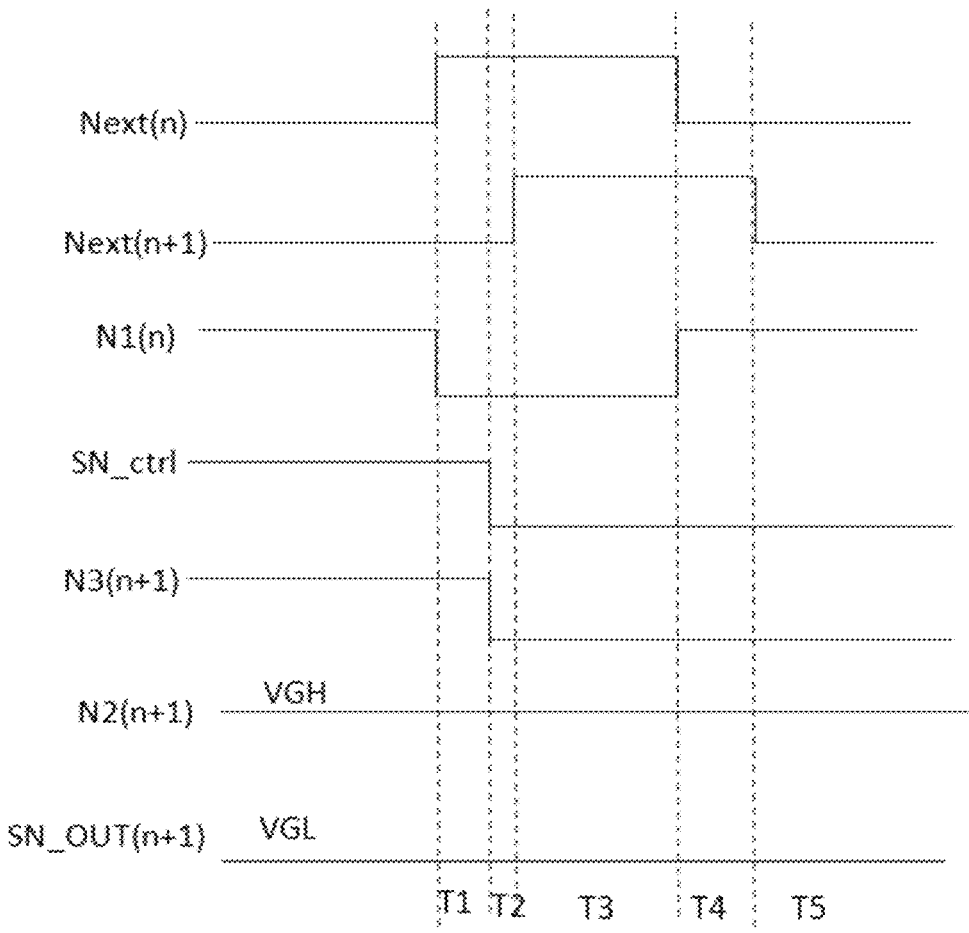
FIG. 8 shows a timing diagram of a gating control signal SN_ctrl hopping from a high level to a low level, according to an embodiment of the present disclosure.

Applied to the circuit shown in FIG. 7 or a circuit equivalent to FIG. 7, within a preset time period after the gating control signal SN_ctrl hops from a high level to a low level, the voltage of the first node N1 maintains a low level, and the voltage of the second node N2 maintains a high level. The level of the third node N3 hops from a high level to a low level synchronously with the gating control signal SN_ctrl. The second plate of the capacitor C1 is coupled to the third node N3. The output signal of the next-level driving circuit maintains a low level within the preset time period, and the level SN_OUT of the gate control signal SN_OUT output by the gating output module is opposite to the level of the second node N2. Further, after the preset time period ends, the output signal of the next-level driving circuit changes to a high level, and in the time period when the output signal of the next-level driving circuit and the output signal of the previous-level driving circuit are both at high levels, the voltage of the first node N1 maintains a low level, the voltage of the second node N2 maintains a high level, and the third node N3 maintains a low level. In addition, in the time period when the output signal of the previous-level driving circuit changes to a low level and the output signal of the next-level driving circuit is at a high level, the voltage of the first node N1 is a high level, the voltage of the second node N2 maintains a high level, and the third node N3 maintains a low level. Specifically, the timing diagram is shown in FIG. 8. With reference to FIG. 7 and FIG. 8, it can be seen that, assuming that the high refresh-to-low refresh conversion is performed at the (n+1)-th level, the gating control signal SN_Ctrl changes from VGH→VGL between Next(n) and Next(n+1), and the level change is divided into the following phases:

T1 phase: the first node N1($n$) hops low, the first switch M1 is turned on, SN_ctrl is written into the third node N3, at which time the third switch M3 is turned on, the second node N2 is written into VGH, and OUT outputs VGL.

T2 phase: SN_ctrl hops low, at which time the third node N3 is written low, Next(n) is written high, the third switch M3 is off, the fourth switch M4 is on, the second node N2 is still written to VGH, and OUT outputs VGL.

T3 phase: the second node N2 maintains VGH, and OUT outputs VGL.

T4 phase: the third switch M3 is off. Due to the existence of the capacitor C1, the third node N3($n$+1) maintains VGL. The fourth switch M4 is on, the second node N2 is VGH, the output OUT is VGL, and thus SN_OUT (n+1) maintains the output VGL, and enters the low-frequency maintenance state, realizing the conversion of high frequency to low frequency. In addition, since the first node N1($n$) is usually at a high level and cascaded progressively, after adding the first switch M1, merely SN_ctrl in the first level is written to couple VGH at the same time. The coupling effect is thus small, thereby improving the display boundary.

Figures 9, 10:
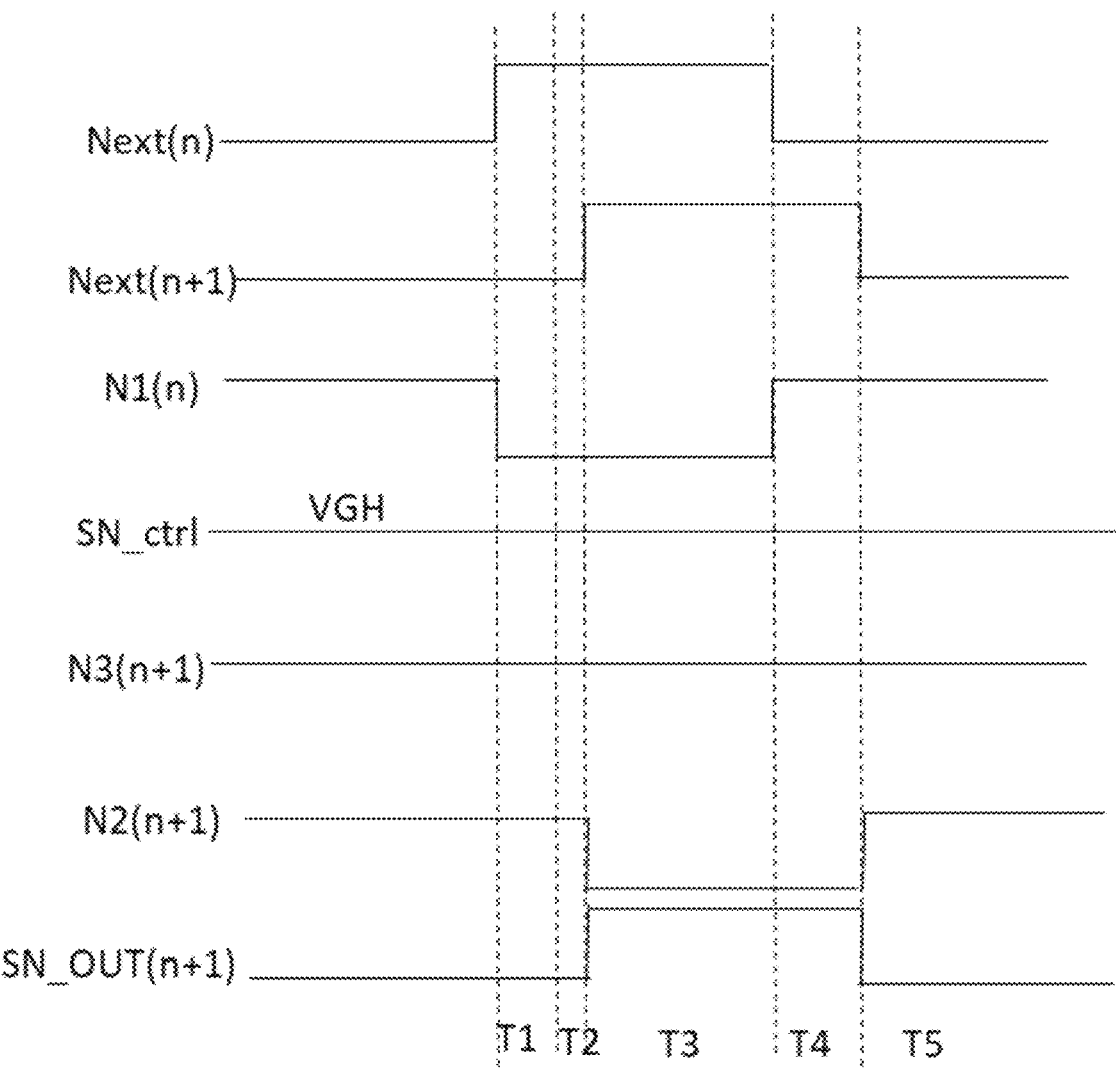
FIG. 9 shows a timing diagram of a high refresh-to-high refresh conversion at a (n+1)-th level, according to an embodiment of the present disclosure.
FIG. 10 shows a working timing diagram of a high-frequency area, according to an embodiment of the present disclosure.

FIG. 9 shows a timing diagram of the high refresh-to-high refresh conversion at the (n+1)-th level, SN_Ctrl maintains VGH, which specifically includes the following phases:

T1 phase: the first node N1(n) hops low, the first switch M1 is turned on, SN_ctrl is written into the third node N3, at which time the third switch M3 is turned on, the second node N2 is written into VGH, and OUT outputs VGL.

T2 phase: SN_ctrl hops low, the third node N3 is written high, Next is written high, the third switch M3 is off, the fourth switch M4 is off, the fifth switch M5 and the sixth switch M6 are on, the second node N2 is written to VGL, and OUT outputs VGH.

T3 phase: N2 maintains VGL, and OUT outputs VGH.

T4 phase: the third switch M3 is turned off. Due to the existence of the capacitor C1, N3(n+1) maintains VGH. The fourth switch M4 is turned off. The second node N2 is VGL. The output OUT is VGH. Thus, SN_OUT (n+1) maintains the output VGL and enters the low-frequency maintenance state, realizing the high frequency-to-low frequency conversion.

T5 phase: Next(n+1) hops low, the sixth switch M6 is off, the third switch M3 is on, the second node N2 is written to VGH, and OUT outputs VGL, thereby achieving normal SN output.

FIG. 10 shows the working sequence of a high-frequency area. OUT normally outputs Next. When the Ctrl signal is written to N3 at a high level, M4 is off and M5 is on. At this moment, when Next is at a high level, M3 is off and M6 is on. VGL is written to the N2 node to output VGH. At this moment, the OUT signal normally outputs a high-level pulse of Next.

Figure 11:
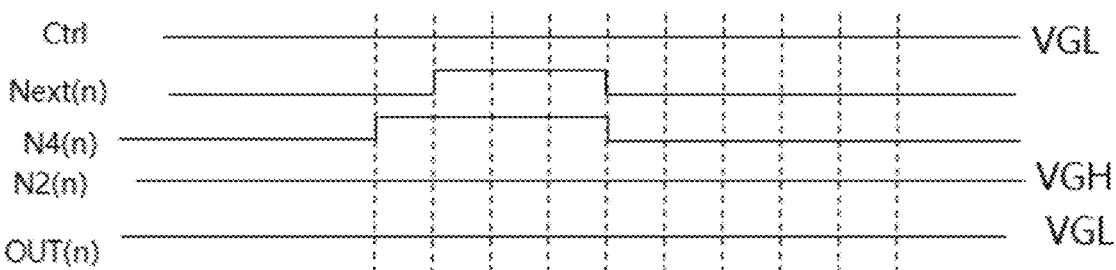
FIG. 11 shows a working timing diagram of a low-frequency area, according to an embodiment of the present disclosure.

FIG. 11 shows the working sequence of a low-frequency area. OUT maintains VGL. When Next is low, M4 is turned on and M5 is turned off. When Next is high, M3 is turned off and M6 is turned on. At this moment, VGH is written into N2 through M4, and M8 is turned on to output a low level. At this moment, the OUT signal maintains a low level, and the panel display enters a low-frequency maintenance state.

Figure 12:
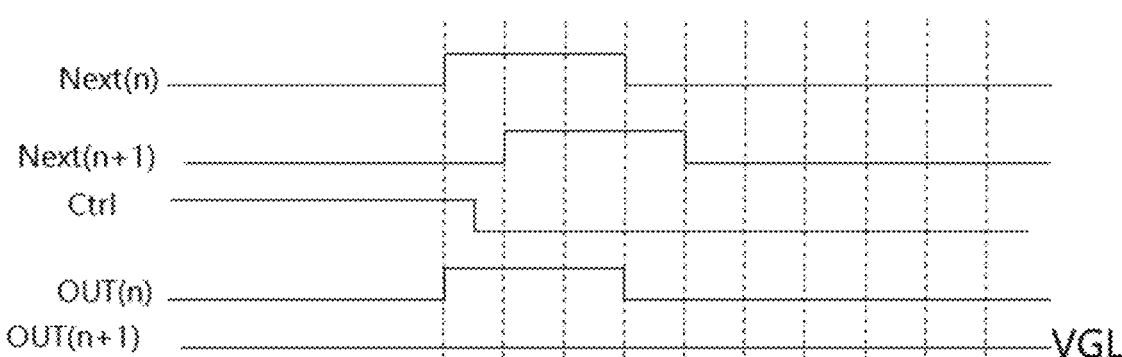
FIG. 12 shows a timing diagram in a first partition refresh mode, according to an embodiment of the present disclosure.

FIG. 12 shows a timing diagram in a first partition refresh mode, in which a high-frequency refresh→low-frequency maintenance conversion is performed between the n-th to the (n+1)-th levels. The corresponding Ctrl signal completes the signal H→L hopping between Next(n) and Next(n+1).

Figure 13:
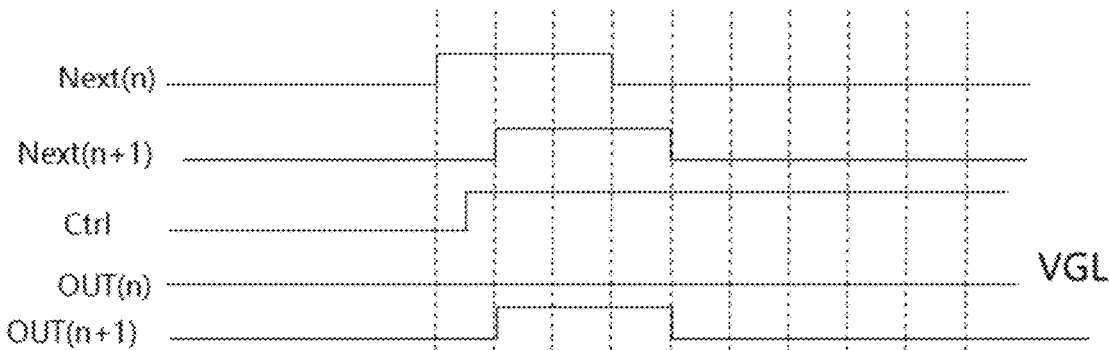
FIG. 13 shows a timing diagram in a second partition refresh mode, according to an embodiment of the present disclosure.

FIG. 13 shows a timing diagram in the second partition refresh mode, in which a low-frequency maintenance→ high-frequency refresh conversion is performed between the n-th to the (n+1)-th levels. The Ctrl signal of the corresponding example completes a signal L→H hopping between Next(n) and Next(n+1).

Figure 14:
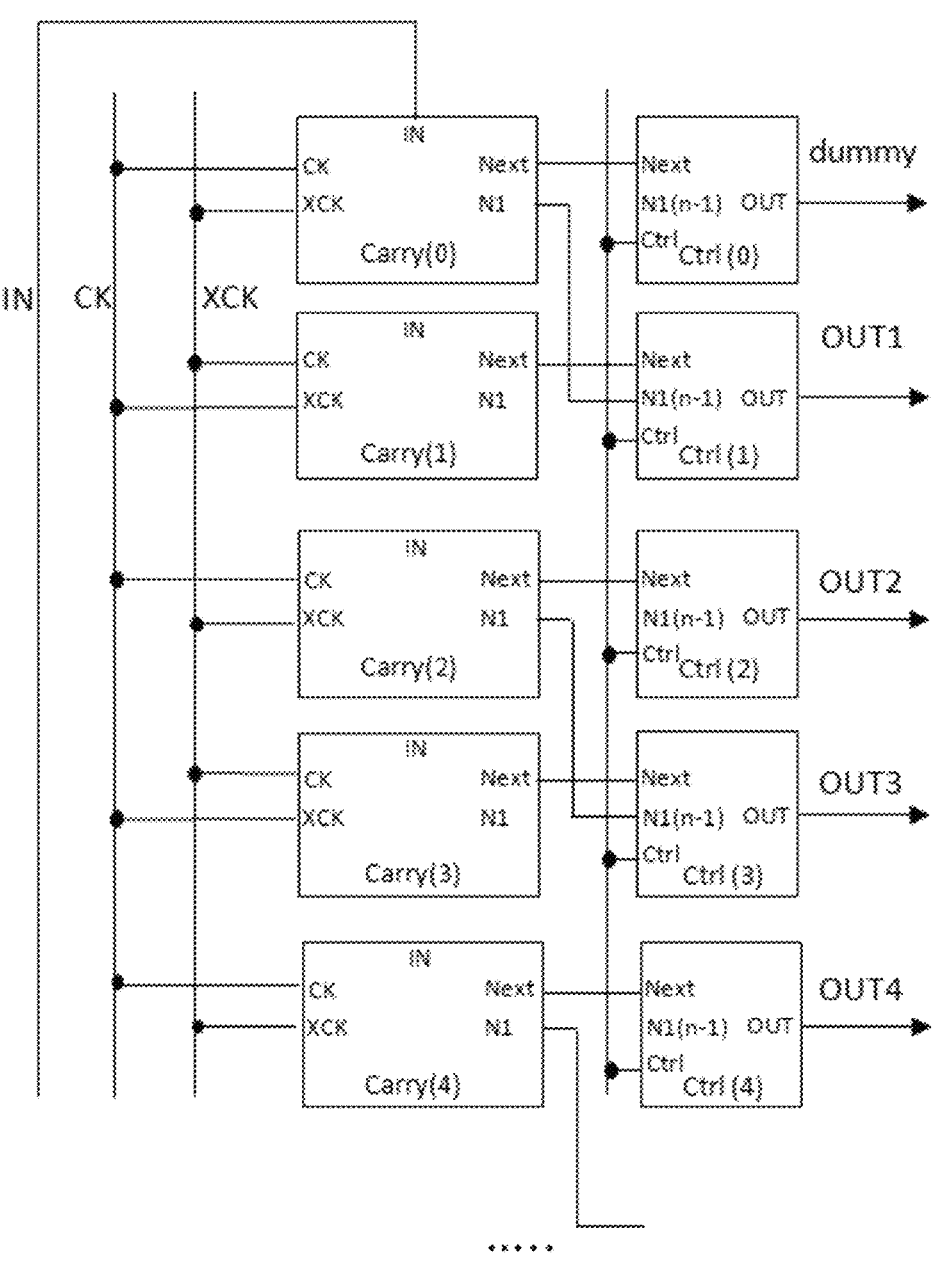
FIG. 14 is a schematic diagram showing a multi-level cascade relationship, according to an embodiment of the present disclosure.

In the embodiments of the present disclosure, the first level of the plurality of levels receives a start signal, a first clock signal, and a second clock signal, all levels receive the first clock signal and the second clock signal, and the first clock access terminals of two adjacent levels receive the first clock signal and the second clock signal, and the second clock access terminals of two adjacent levels receive the first clock signal and the second clock signal. Specifically, as shown in FIG. 14, the first level receives a start signal IN, the first clock signal is CK, and the second clock signal is XCK.

Further, the first clock signal and the second clock signal have the same frequency, and there is a phase difference between the second clock signal and the first clock signal.

Further, each of the plurality of levels drives at least one row of pixel units.

Figure 15:
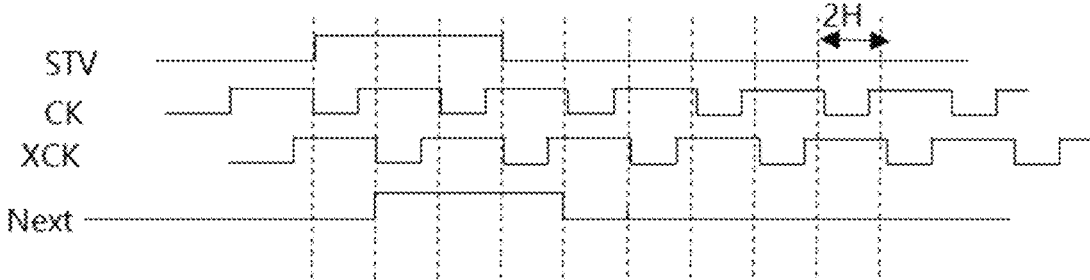
FIG. 15 is a schematic diagram showing a phase difference between a second clock signal and a first clock signal, according to an embodiment of the present disclosure.

Furthermore, the number of rows of pixel units driven at each level determines the phase difference between the second clock signal and the first clock signal. Specifically, as shown in FIG. 15, the H value is the row time of the panel scan, and the timing diagram is an example of one driving two, that is, one circuit unit drives two rows of pixel units, and the waveform phase is progressive according to 2H (i.e., two rows of pixel units).

More specifically, all switches involved in the embodiments of the present disclosure are transistors.

Figure 16:
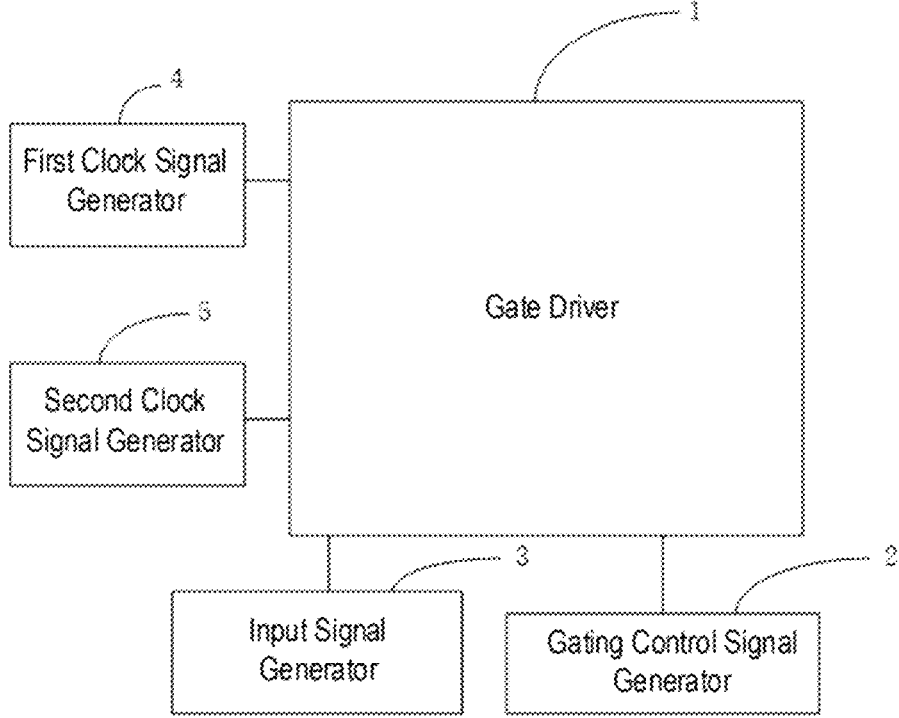
FIG. 16 shows a schematic diagram of a first display panel, according to an embodiment of the present disclosure.

Based on the same inventive concept, an embodiment of the present disclosure also provides a display panel. As shown in FIG. 16, the display panel includes a gate driver 1; a gating control signal generator 2, configured to generate a gating control signal; an input signal generator 3, configured to generate an input signal; a first clock signal generator 4, configured to generate a first clock signal; and a second clock signal generator 5, configured to generate a second clock signal.

Figure 17:
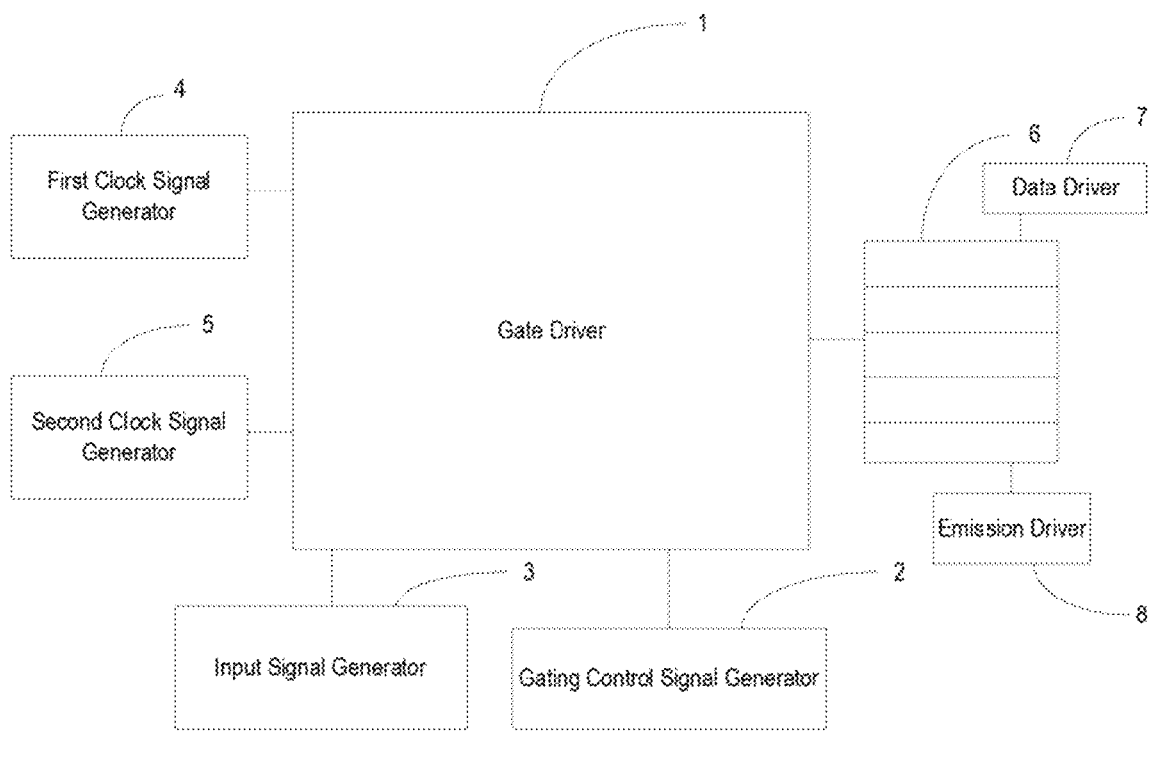
FIG. 17 shows a schematic diagram of a second display panel, according to an embodiment of the present disclosure.

Further, as shown in FIG. 17, the display panel also includes multiple rows of pixel units 6. The gate driver 1 is configured to provide gate control signals to the pixel units 6; the data driver 7 is configured to provide data voltages to the pixel units 6; and the emission driver 8 is configured to provide emission signals to the pixel units 6.

It should be noted that the multiple rows of pixel units 6 in FIG. 17 of the present disclosure are for illustration only and do not limit the number of rows of pixel units in the solution of the present disclosure.

Figure 18:
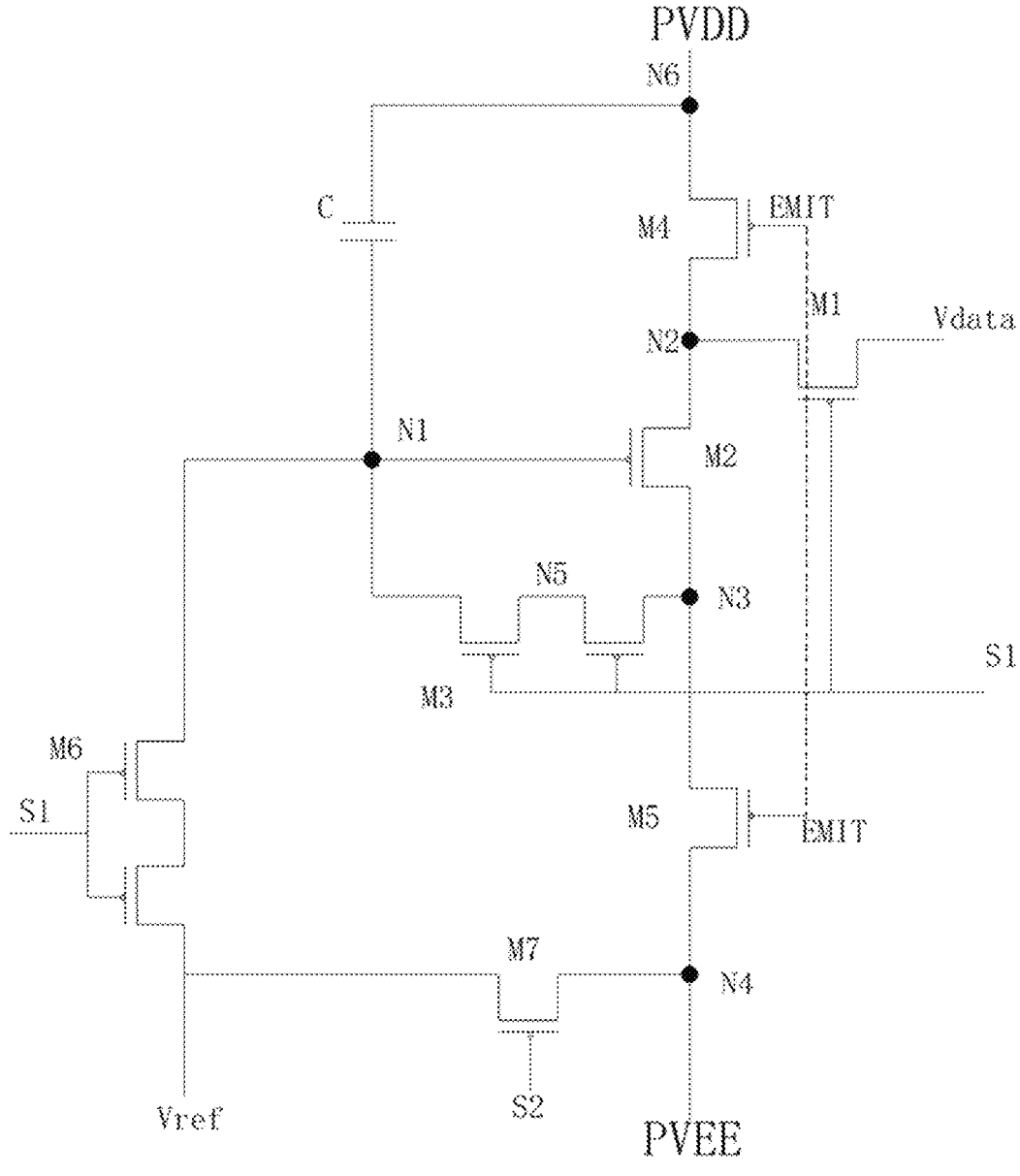
FIG. 18 shows a schematic diagram of a first pixel driving circuit, according to an embodiment of the present disclosure.
Figure 19:
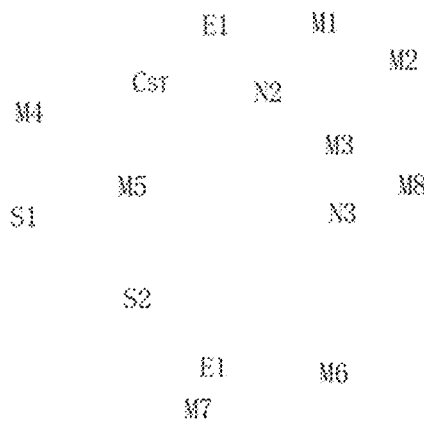
FIG. 19 shows a schematic diagram of a second pixel driving circuit, according to an embodiment of the present disclosure.
Figure 20:
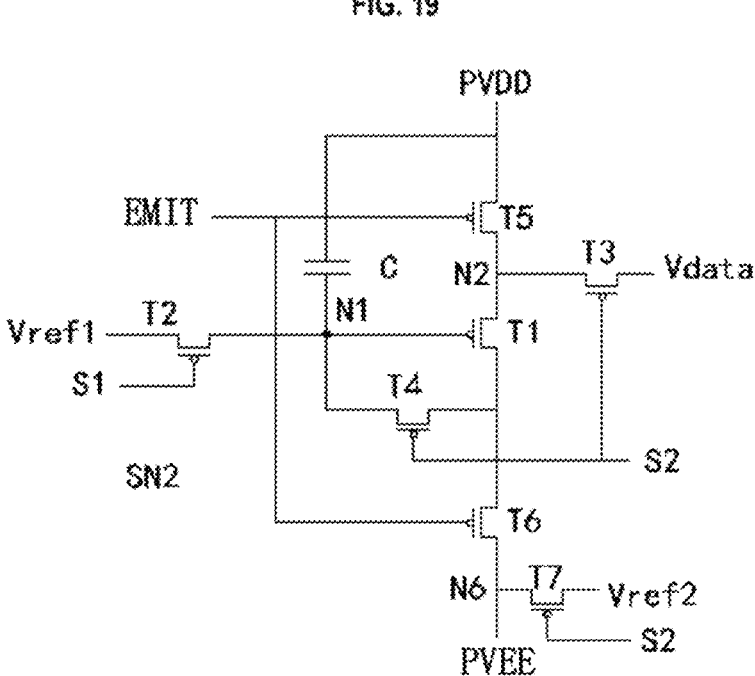
FIG. 20 shows a schematic diagram of a third pixel driving circuit, according to an embodiment of the present disclosure.

Specifically, a pixel unit includes a pixel driving circuit, as shown in FIGS. 18, 19 and 20, three kinds of pixel driving circuits are shown. Apparently, the pixel driving circuits other than those shown in the embodiments of the present disclosure are also contemplated. The SN_OUT gate control signal output by the gate driver is connected to the scan line S1 or the scan line S2 in FIGS. 18 to 20. In practical applications, two gate drivers need to be configured for the scan line S1 and the scan line S2. The data voltage output by the data driver is connected to the data line Vdata in FIG. 18, the data line DATA in FIG. 19, and the data line Vdata in FIG. 20. The emission signal output by the emission driver is connected to the light-emitting control signal line EMIT in FIG. 18, the light-emitting control signal line E1 in FIG. 19, and the light-emitting control signal line EMIT in FIG. 20. The gate driver, the data driver, and the emission driver provide corresponding driving signals to the pixel driving circuit, and the pixel driving circuit drives the light-emitting element to emit light to finally realize display, where the light-emitting element can be selected as LED, OLED, miniLED, etc.

Furthermore, the display panel also includes a substrate structure, and multiple rows of pixel units, the gate driver, the data driver, the emission driver, the input signal generator, the first clock signal generator, and the second clock signal generator are all disposed on the substrate structure. In addition, the gate driver, the data driver, the emission driver, the input signal generator, the first clock signal generator, and the second clock signal generator in the present disclosure are all modular structures that are conveniently disposed on the substrate structure, which is convenient for the preparation of the display panel.

Figure 21:
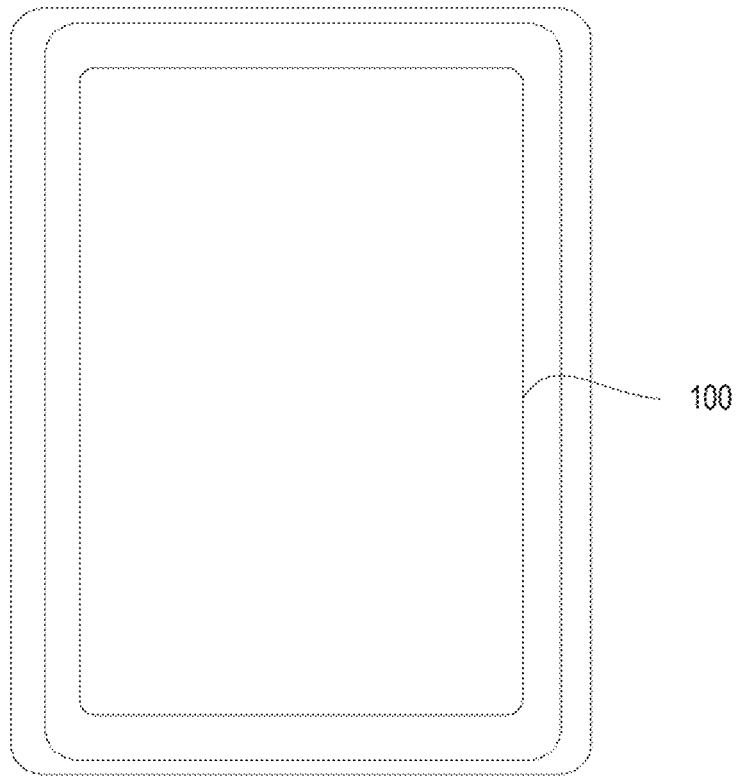
FIG. 21 shows a schematic diagram of a display device, according to an embodiment of the present disclosure.

Based on the same inventive concept, an embodiment of the present disclosure further provides a display device. As shown in FIG. 21, the display device includes a display panel 100. The specific structure of the display panel 100 has been described in detail in the above embodiments and will not be repeated here. Apparently, the display device shown in FIG. 21 is merely for schematic illustration, and the display device can be any electronic device with a display function, such as a mobile phone, a tablet computer, a laptop computer, an e-book, or a television.

Through applying the technical solution of the present disclosure, the gate of the first switch in each level except a first level among the plurality of levels is connected to the first node of the previous-level driving circuit, that is, under this connection mode, a new first switch is added in the gating control signal writing module and driven by the voltage of the first node of the driving circuit. Since the first node is usually a high-level signal, the first switch is usually in the off state, thereby reducing the coupling between the signal input to the gating control signal writing module and VGH, thereby avoiding the partition refresh boundary split screen phenomenon.

It should be noted that the various embodiments in this specification are described in a progressive manner, and each embodiment focuses on the differences from other embodiments. The same or similar parts between the various embodiments can be referenced to each other.

It should be also noted the above are merely some embodiments of the present disclosure and the technical principles used. Those skilled in the art will understand that the present disclosure is not limited to the specific embodiments described herein, and that various obvious changes, readjustments, combinations and substitutions can be made by those skilled in the art without departing from the scope of protection of the present disclosure. Therefore, although the present disclosure is described in more detail through the above embodiments, the present disclosure is not limited to the above embodiments, and may include other equivalent embodiments without departing from the concept of the present disclosure, and the scope of the present disclosure is determined by the scope of the appended claims.

What is claimed is:

1. A gate driver, comprising a plurality of levels that sequentially output a gate control signal through a gate control line, each of the levels comprising a driving circuit and a gating circuit, wherein:
   the driving circuit includes a pull-up module; and
   the gating circuit includes a gating control signal writing module, wherein the gating control signal writing module includes a first switch, wherein a gate of the first switch in each level, except a first level among the multiple levels, is connected to a first node of a previous-level driving circuit, and a voltage of the first node of the previous level driving circuit is configured to drive the gating control signal writing module of a current level, so that a signal written by the gating control signal writing module is jointly controlled by the first node of the previous level and an output signal of the driving circuit of the current level.

2. The gate driver according to claim 1, wherein:
   the gating control signal writing module further includes a capacitor and a second switch; and
   the capacitor, the first switch and the second switch are connected in series, a first plate of the capacitor is connected to a first power supply, a gate of the second switch is connected to an output end of the driving circuit, and a signal input end of the second switch inputs a gating control signal.

3. The gate driver according to claim 2, wherein both the first switch and the second switch are P-type switch tubes.

4. The gate driver according to claim 2, wherein:
   the gating circuit further includes a gating control module and a gating output module;
   the output end of the driving circuit is connected to gates of switches in the gating control module, and the gating output module outputs the gate control signal; and
   under an action of the gating control signal and an output signal of the driving circuit, the switches in the gating control module are controlled to be turned on or off so that the gate control signal is at a high level or a low level.

5. The gate driver according to claim 4, wherein:
   the gating control module includes a third switch, a fourth switch, a fifth switch and a sixth switch;
   the third switch and the fourth switch are coupled between a second node and a first power source, the fifth switch and the sixth switch are coupled between the second node and a second power source; and
   a gate of the third switch and a gate of the sixth switch are connected to the output end of the driving circuit, a gate of the fourth switch is connected to a second plate of the capacitor, and a gate of the fifth switch is connected to a first end of the first switch.

6. The gate driver according to claim 5, wherein the third switch and the fourth switch are both P-type switch tubes, and the fifth switch and the sixth switch are both N-type switch tubes.

7. The gate driver according to claim 5, wherein, within a preset time period after the gating control signal hops from a high level to a low level, the voltage of the first node maintains a low level, a voltage of the second node maintains a high level, a level of a third node hops from a high level to a low level synchronously with the gating control signal, the second plate of the capacitor is coupled to the third node, an output signal of a next-level driving circuit maintains a low level within the preset time period, and a level of the gate control signal output by the gating output module is opposite to a level of the second node.

8. The gate driver according to claim 7, wherein after the preset time period ends, the output signal of the next-level driving circuit changes to a high level, and during a time period in which the output signal of the next-level driving circuit and an output signal of the previous-level driving circuit are both at high levels, the voltage of the first node maintains a low level, the voltage of the second node maintains a high level, and the third node maintains a low level.

9. The gate driver according to claim 8, wherein, during a time period when the output signal of the previous-level driving circuit changes to a low level and the output signal of the next-level driving circuit is a high level, the voltage of the first node is a high level, the voltage of the second node maintains a high level, and the third node maintains a low level.

10. The gate driver according to claim 4, wherein:
   the gating output module includes a seventh switch and an eighth switch;
   a first end of the seventh switch is connected to a first power source, a gate of the seventh switch and a gate of the eighth switch are coupled to a second node; and
   a second end of the seventh switch is connected to a second end of the eighth switch, a first end of the eighth switch is connected to a second power supply, and a control signal line is led between the second end of the seventh switch and the second end of the eighth switch to output the gate control signal.

11. The gate driver according to claim 10, wherein the seventh switch is a P-type switch tube, and the eighth switch is an N-type switch tube.

12. The gate driver according to claim 1, wherein a first level of the plurality of levels receives a start signal, a first clock signal, and a second clock signal, all levels receive the first clock signal and the second clock signal, and first clock access terminals of two adjacent levels receive the first clock signal and the second clock signal, respectively, and second clock access terminals of two adjacent levels receive the first clock signal and the second clock signal, respectively.

13. The gate driver according to claim 12, wherein:

the first clock signal and the second clock signal have a same frequency; and there is a phase difference between the second clock signal and the first clock signal.

14. The gate driver according to claim 1, wherein each of the plurality of levels drives at least one row of pixel units.

15. The gate driver according to claim 13, wherein a quantity of rows of pixel units driven by each level determines the phase difference between the second clock signal and the first clock signal.

16. A display device, comprising a display panel including the gate driver according to claim 1.

17. A gate driver, comprising a plurality of levels that sequentially output a gate control signal through a gate control line, each of the levels comprising a driving circuit and a gating circuit, wherein:

the driving circuit includes a pull-up module;

the gating circuit includes a gating control signal writing module, wherein the gating control signal writing module includes a first switch, wherein a gate of the first switch in each level, except a first level among the multiple levels, is connected to a first node of a previous-level driving circuit, and a voltage of the first node is configured to drive the pull-up module;

the driving circuit further includes a pull-down module, a pull-up control module and a pull-down control module;

the pull-up control module is configured to generate a pull-up driving signal for driving the pull-up module, and the pull-down control module is configured to generate a pull-down driving signal for driving the pull-down module; and the pull-up module and the pull-down module are coupled between a first power supply and a second power supply, and a signal line leads out from a common node of the pull-up module and the pull-down module to output an output signal of the driving circuit.

18. The gate driver according to claim 17, wherein the pull-up module and the pull-down module are both P-type switch tubes.

19. A display panel, comprising a gate driver that includes a plurality of levels that sequentially output a gate control signal through a gate control line, each of the levels including a driving circuit and a gating circuit, wherein:

the driving circuit includes a pull-up module; and the gating circuit includes a gating control signal writing module, wherein the gating control signal writing module includes a first switch, wherein a gate of the first switch in each level, except a first level among the plurality of levels, is connected to a first node of a previous-level driving circuit, and a voltage of the first node of the previous level driving circuit is configured to drive the gating control signal writing module of a current level, so that a signal written by the gating control signal writing module is jointly controlled by the first node of the previous level and an output signal of the driving circuit of the current level, wherein the display panel further includes:

a gating control signal generator, configured to generate a gating control signal;

an input signal generator, configured to generate an input signal;

a first clock signal generator, configured to generate a first clock signal; and a second clock signal generator, configured to generate a second clock signal.

20. The display panel according to claim 19, wherein the display panel further includes:

a plurality of rows of pixel units, the gate driver being configured to provide gate control signals to the pixel units;

a data driver, configured to provide a data voltage to the pixel units; and an emission driver, configured to provide an emission signal to the pixel units.

* * * * *